United States Patent [19]
George

[11] 3,980,959
[45] Sept. 14, 1976

[54] TUNER BANDSWITCHING SYSTEM FOR A TELEVISION TUNING SYSTEM

[75] Inventor: John Barrett George, Indianapolis, Ind.

[73] Assignee: RCA Corporation, New York, N.Y.

[22] Filed: June 3, 1974

[21] Appl. No.: 476,083

[52] U.S. Cl. .................................. 325/470; 325/459
[51] Int. Cl.² .......................................... H04B 1/32
[58] Field of Search ........... 325/453, 455, 457, 459, 325/460, 468, 470, 464; 334/15, 16; 178/DIG. 15; 329/139, 178; 331/1 A, 2, 8, 16, 17, 179

[56] References Cited
UNITED STATES PATENTS

| | | |
|---|---|---|
| 3,259,851 | 7/1966 | Brauer .................................. 331/1 A |
| 3,818,353 | 6/1974 | Sakamoto ........................... 325/422 |
| 3,846,707 | 11/1974 | Sakamoto ........................... 325/453 |
| 3,857,107 | 12/1974 | Lieberman et al. .................. 331/1 A |

Primary Examiner—Robert L. Griffin
Assistant Examiner—Marc E. Bookbinder
Attorney, Agent, or Firm—Eugene M. Whitacre; Kenneth R. Schaefer; Peter M. Emanuel

[57] ABSTRACT

A tuner bandswitching system for a television receiver tuning system wherein a reset pulse generated at the completion of the selection of a channel to be received is utilized to determine the initial stable state of a series of bistable circuits and to provide a bandswitch reset pulse for use in establishing an initial voltage output from a voltage sweep generator utilized to scan a varactor tuned VHF tuner or a varactor tuner through one or more bands of frequencies. The bistable circuits control switching voltages supplied to the VHF tuner and the UHF tuner to provide for sequencing of the tuning system serially through, for example, the low VHF band, the high VHF band, and the UHF band until the appropriate band has been selected wherein the selected channel can be tuned. When the selected channel is tuned, a hold signal is developed. Data identifying the channel being received during a sweep through a given band is accumulated in a counter. At a predetermined output of the counter (e.g., "06" or "13") in the absence of the hold signal, the state of the bistable circuits is changed. As the state of a bistable circuit is changed, a bandswitch reset pulse is provided to again reset the voltage sweep generator in preparation for the scanning of the next band in the aforementioned sequence of bands.

8 Claims, 2 Drawing Figures

3,980,959

TUNER BANDSWITCHING SYSTEM FOR A TELEVISION TUNING SYSTEM

BACKGROUND OF THE INVENTION

This invention relates to television tuning systems and more particularly to a system for controlling the band of radio frequencies being received to provide for a sequential sweep of a tuner through a plurality of bands.

A tuning system which provides for the selection of any one of a plurality of television channels in, for example three bands of radio frequencies, is disclosed in my copending application Ser. No 476,081 filed concurrently herewith and entitled, "Randon Channel Address Crystal-Lock Tuning System", now U.S. Pat. No. 3,924,192. To access a given channel, data representative to the channel selected is inserted into a memory. An oscillator of an appropriate tuner for tuning one of the three radio frequency bands is swept throughout a band of ocsillator frequencies. As the oscillator is swept, the oscillator signal is compared to a plurality of harmonically related frequency samples which are spaced apart by a frequency related to a regular channel spacing. A counter accumulates a count representative of the number of frequency comparison conditions encountered during a period of sweeping of the oscillator. When the count inserted in the memory equals the count in the counter, sweeping of the oscillator is stopped and the oscillator is held at a frequency determined by one of the harmonically related samples nearest the oscillator frequency and an automatic fine tuning correction signal.

The oscillator of the tuner utilized to tune the first band is modified to tune the second of the three radio frequency bands, and, in the case of the channel allocations employed in the Unites States, a second tuner is activated to tune the third of the three radio frequency bands. The tuning system, therefore, provides a modification of the oscillator to facilitate sweeping more than one band of frequencies or switching to a separator tuner. Also, resetting of the sweep generator upon accumulation of predetermined counts in the counter in the absence of a hold signal is provided.

SUMMARY OF THE INVENTION

In a television tuning system for the selection of any one of a plurality of television channels in at least first and second bands of frequencies by sweeping an oscillator through at least third and fourth bands of frequencies a system is provided for controlling the operating frequency range of the television tuning system. The system for controlling the operating frequency range includes a counting means which counts the number of times the oscillator passes through a frequency related in a predetermined manner to a television channel oscillator frequency. A storage means stores numerical data representative of a selected channel. A count comparison means produces a hold signal when data in the counting means and the storage means correspond. A control signal generating means produces control signals in response to simultaneous presence in the counting means of a count representative of a channel at one end of at least the first band of frequencies and absence of the hold signal. A switching means is responsive to the control signals for switching the operating range of the oscillator at least from the third band to the fourth band of frequencies.

BRIEF DESCRIPTION OF THE DRAWINGS

These and other aspects of the invention will be more readily apparent from a consideration of the following description when taken in connection with the accompanying drawings, in which.

DETAILED DESCRIPTION OF THE DRAWINGS

While this invention may be utilized where various channel number and frequency allocations are employed, it will be described in the context of the channel allocations employed in the United States to avoid undue complication of any understanding of the invention.

Figure 1:
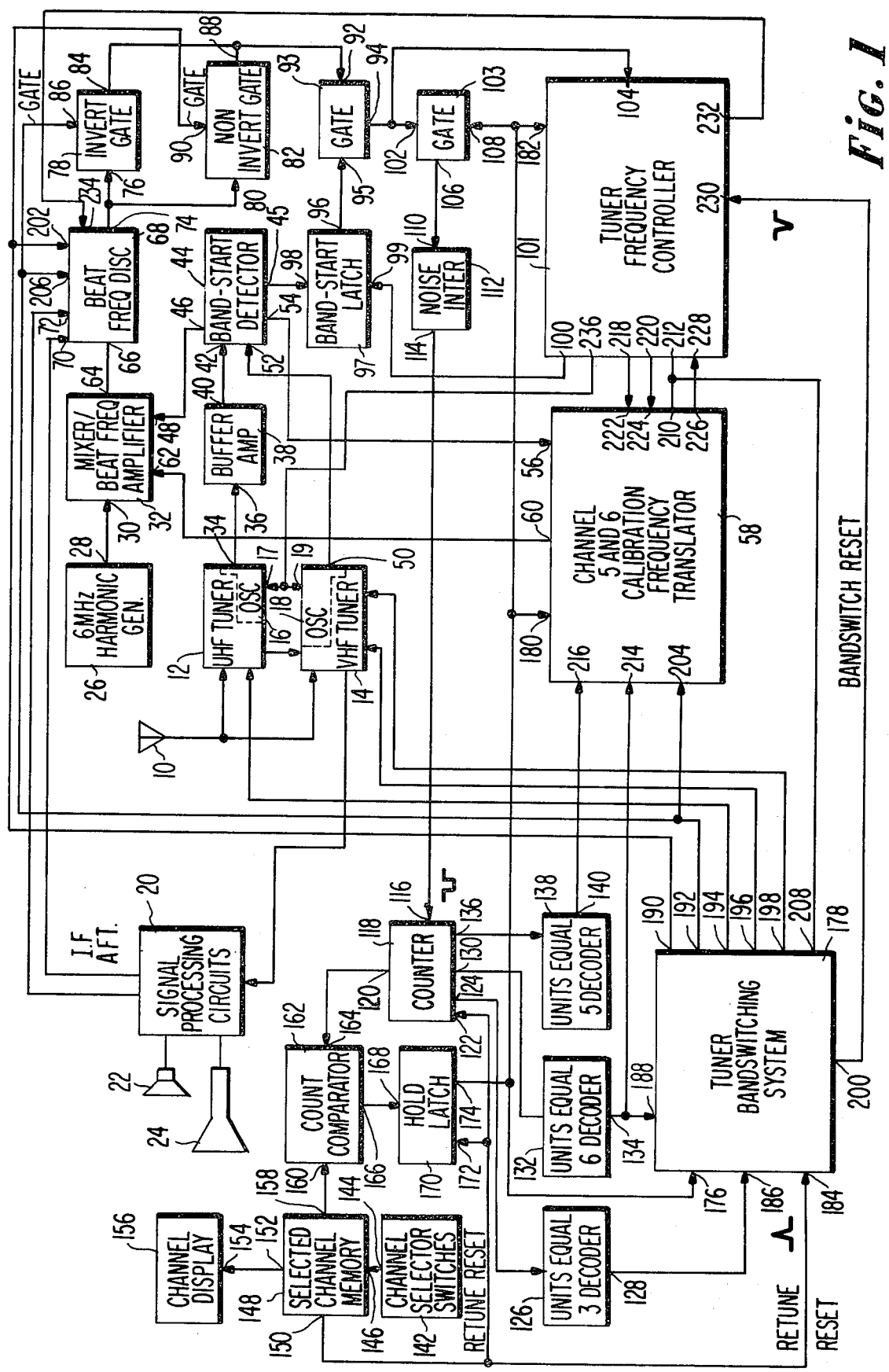
FIG. 1 illustrates in block form a television receiver including a tuning system incorporating the present invention.

In the system of FIG. 1, details of which are set forth in my above-referenced copending application, channel numbers are entered into the tuning system of the television receiver by means of channel selector switches 142 which may, for example, be an arrangement of the type used in small electronic calculating machines. As each digit of the channel number is entered, the data is transferred to a selected channel memory 148. The channel number data held in memory 148 is coupled to a channel display 156. Upon the completion of a selection of the second digit of a channel number, a reset pulse is generated by the selected channel memory 148 and is coupled to a terminal 122 of a counter 118, to a terminal 172 of a hold latch 170, and to a terminal 184 of a tuner bandswitching system 178. The reset pulse applied to the terminal 122 of counter 118 provides a reset of the counter 118 to an initial (e.g., 00) count stage. The reset pulse applied to the terminal 172 of hold latch 170 provides for an initial condition (e.g., zero volts) at a terminal 174 of hold latch 170. The reset pulse applied to the terminal 184 of tuner bandswitching system 178 provides for a reset of the tuner bandswitching system to a first tuning band (e.g., the low VHF band) and produces a banswitch reset pulse at a terminal 200 which is coupled to a terminal 230 of a tuner frequency controller 101. The bandswitch reset pulse applied to the tuner frequency controller 101 resets the voltage at a terminal 236 of the tuner frequency controller to an initial condition (e.g., 0 volts) and produces a reset pulse at a terminal 100 of the tuner frequency controller 101 which, in turn, is coupled to a terminal 99 of a bandstart latch 97. The reset pulse on the terminal 99 of bandstart latch 97 provides for an initial state (e.g., 0 volts) at a terminal 96 which is coupled to the terminal 95 of a gate 93 to disable the gate 93 and thereby prevent signal flow between a terminal 92 and a terminal 94 of the gate 93.

The terminal 174 of hold latch 170 is coupled to a terminal 176 of tuner bandswitching system 178, to be described in detail subsequently in conjunction with FIG. 2, to a terminal 180 of a channel 5 and 6 calibration frequency translator 58, to a terminal 108 of a gate 103, and a terminal 182 of the tuner frequency controller 101. With zero volts supplied by hold latch 170 to the terminal 108 of the gate 103, signal can flow between a terminal 102 and a terminal 106. With zero volts on terminal 182 of the tuner frequency controller 101, that apparatus is arranged to produce a ramp voltage, i.e., the voltage at the terminal 236 becomes more positive as a function of time. This ramp voltage is coupled to a terminal 17 of an oscillator 16 of a UHF tuner 12 and to a terminal 19 of an oscillator 18 of a VHF tuner 14. As the voltage on terminal 236 becomes more positive, the frequency of the oscillator 18 increases (oscillator 16 being operational only when sweeping the UHF band). A sample of the oscillator signal existing at a terminal 50 of the oscillator 18 is coupled to a terminal 52 of a bandstart detector 44.

As the frequency of the oscillator 18 continues to increase with increasing voltage at the terminal 236 of the tuner frequency controller 101, the oscillator signal reaches a predetermined frequency (for example, 93 MHz which is 8 MHz below the industry standard oscillator frequency for U.S. channel 2), and a terminal 45 of the bandstart detector 44 becomes more positive. This positive voltage change at the terminal 45 is coupled to a terminal 98 of the bandstart latch 97 to set the bandstart latch and create a positive voltage on the terminals 96 and 95. Gate 93 is thereby enabled and provides for signal flow between the terminals 92 and 94.

The terminal 52 of the bandstart detector 44 is also coupled to a terminal 54 of the bandstart detector 44, which is coupled to a terminal 56 of the channel 5 and 6 calibration frequency translator 58. When counter 118 has not yet received pulses at a terminal 116 which would advance the count from the 00 count, the oscillator signal at terminal 56 is directly coupled to a terminal 60 of the channel 5 and 6 calibration frequency translator 58. The signal appearing at the terminal 60 is coupled to a terminal 62 of a mixer/beat frequency amplifier 32.

A harmonic generator 26, which is arranged to generate reference signals spaced apart by a normal channel spacing (e.g., 6 MHz), couples such reference signals via a terminal 28 to a terminal 30 of the mixer-beat frequency amplifier 32. Signals existing at the terminal 30 and the terminal 62 of the mixer/beat frequency amplifier 32 are mixed, filtered and amplified and the resultant beat or difference frequency appears at a terminal 64. The terminal 64 is coupled to a terminal 66 of the beat frequency discriminator 68 where the beat frequency is compared to a predetermined frequency range. If the beat frequency is greater than the predetermined frequency range, a first condition (e.g., 0 voltage) appears at a terminal 74. If the beat frequency is less than the predetermined frequency range, a second voltage condition (e.g., a positive voltage) appears at terminal 74. A change in voltage (a pulse) therefore appears at terminal 74 each time the oscillator 18 is swept through a range of frequencies greater than the spacing between channels.

Pulses appearing at the terminal 74 are coupled to terminal 92 of the gate 93 either by an inverting gate 78 (during VHF reception) or a non-inverting gate 82 (during UHF reception). Signals existing at terminal 92 are coupled via the gate 93, the gate 103 and a noise integrator 112 to terminal 116 of the counter 118. As the frequency of the oscillator 18 increases and pulses are generated at the terminal 74 of the beat frequency discriminator 68, the counter 118 will provide an output at a terminal 120 which more nearly equates to the data stored in the selected channel memory 148 with each pulse, When the data in the counter 118 equals the data in the selected channel memory 148, the count comparator 162 produces a voltage transition at a terminal 166 of the count comparator 162. This voltage transition sets the hold latch 170 and creates a predetermined voltage (e.g., positive) on the terminal 174 of the hold latch 170. With such a voltage on the terminal 174, the tuner frequency controller stops sweeping the voltage at the terminal 236 and the gate 103 inhibits the flow of signals between terminal 102 and the terminal 106.

When channel 5 or channel 6 is selected by the channel selector switches 142, and the counter 118 has reached a count of 05 or 06, respectively (VHF oscillator 18 at 119 or 125 MHz, respectively), the channel 5 and 6 calibration frequency translator 58 reduces the frequency of the oscillator signal at the terminal 56 by a particular amount (e.g., 52 MHz) and this difference frequency signal is coupled to the terminal 60. This non-uniform treatment of the oscillator signal at terminal 56 is made necessary by the fact that the oscillator frequencies utilized for the reception of channels 5 and 6 in the United States are not related to harmonics of the 6 MHz harmonic generator in the same manner as other VHF channels.

When high VHF band channels (7–13) are selected by the channel selector switches 142, the tuner bandswitching system is reset by a pulse (e.g., positive) applied to the terminal 184. The terminal 184 is coupled via an inverting amplifier 914 to a bandswitch reset control circuit which provides a bandswitch reset pulse (e.g., negative) at a terminal 200. Also, the output of the inverting amplifier is coupled to two bistable or flip-flop circuits. One flip-flop determines whether voltage is supplied to a terminal 190 for operating the UHF tuner or a terminal 192 for operating the VHF tuner and the other flip-flop determines whether voltage is supplied to a terminal 196 for operating the low VHF band portion of the VHF tuner or a terminal 198 for operating the high VHF band portion of the VHF tuner. Upon applying the reset pulse to the flip-flops, one flip-flop is placed in the VHF band mode and the other flip-flop is placed in the low VHF band mode and the output terminals of the flip-flops are coupled to a drive network which supplied voltages to terminals 192 and 198. When the counter reaches a count of 06, a pulse is supplied to the low VHF band-high VHF band flip-flop via a terminal 199, an inverting amplifier and a NAND gate to place the flip-flop in the high VHF band mode. The bandswitch reset pulse is supplied to terminal 200 as a result of the change of mode of the flip-flop and voltages are suppled to terminals 192 and 196 via the drive network.

When UHF band channels (14–83) are selected by the channel selector switches 142, the tuner bandswitching system is reset in the same manner as when high VHF band channels are selected. When the counter reaches a count of 06, the low VHF band-high VHF band flip-flop is shifted to the high VHF band mode as when high VHF band channels are selected. When the counter reaches a count of 13, a pulse is supplied to the VHF band-UHF band flip-flop via a terminal 186, an inverting amplifier and a NAND gate to place the VHF-UHF flip-flop in the UHF mode. The bandswitch reset pulse is supplied to terminal 200 as a result of the change of mode of the flip-flop and positive voltages are supplied to terminals 190 and 196 via the drive network.

Figure 2:
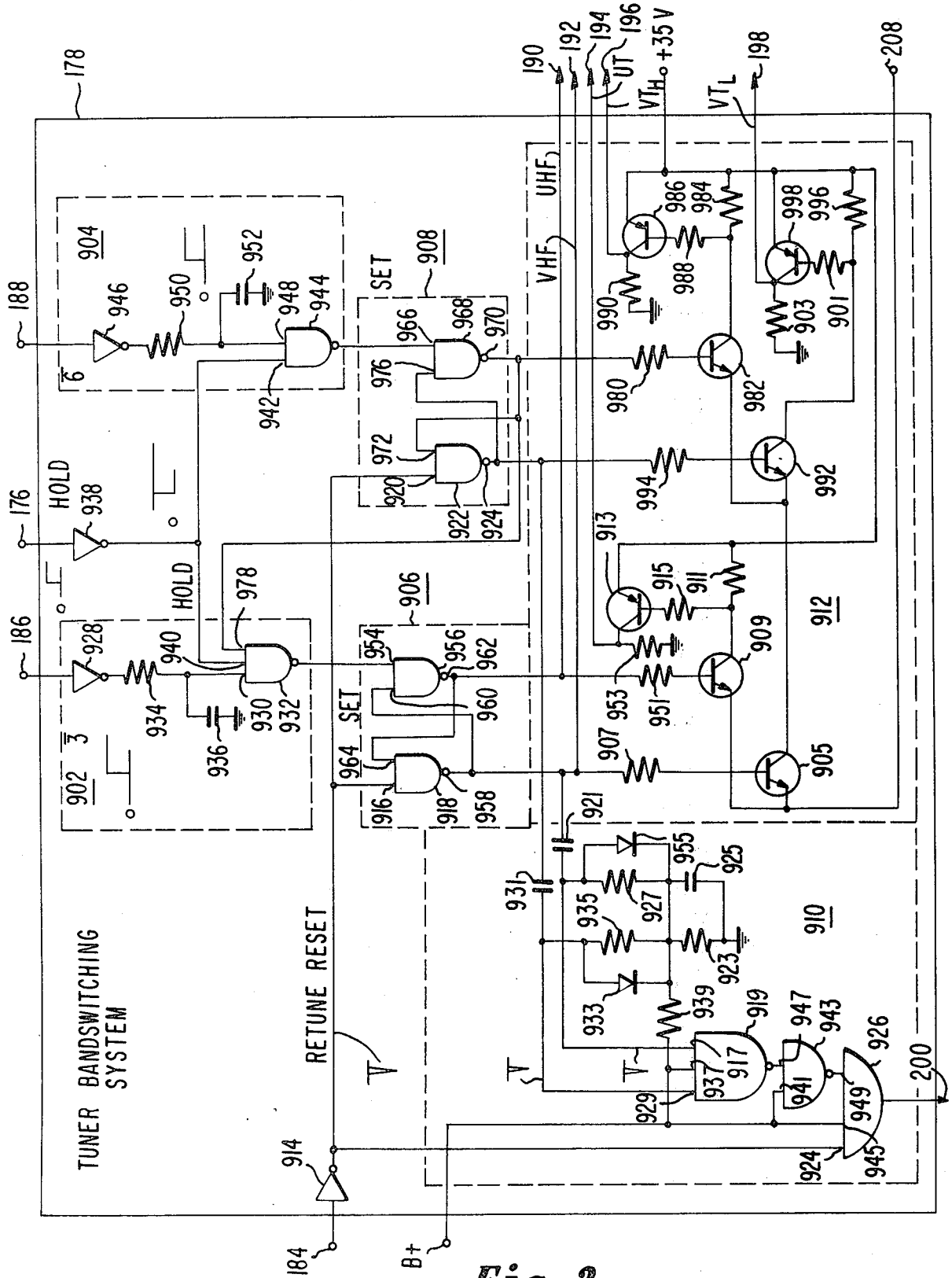
FIG. 2 illustrates in schematic form a tuner bandswitching system constructed in accordance with the present invention.

In FIG. 2, which has its external terminals connected in the system as indicated in FIG. 1, tuner bandswitching system 178 comprises a VHF to UHF control circuit 902, a low VHF band to high VHF band control circuit 904, a VHF-UHF flip-flop 906, a low VHF band-high VHF band flip-flop 098, a bandswitch reset control circuit 910, and a tuner driver network 912.

Reset pulses applied to terminal 184 are coupled to the input of an inverting amplifier 914. The output of inverting amplifier 914 is coupled to a first input terminal 916 of a dual input NAND gate 918 of VHF-UHF flip-flop (bistable circuit) 906, to a first input terminal 920 of a dual input NAND gate 922 of low VHF band-high VHF band flip-flop (bistable circuit) 908, and to a first input terminal 924 of a triple input AND gate 926 of bandswitch reset control circuit 910.

A voltage having a level representative of when a three count is in the units register of the counter 118 is supplied to terminal 186 which is coupled to the input of an inverting amplifier 928 of VHF to UHF control circuit 902. The output of inverting amplifier 928 is coupled to a first input terminal 930 of a triple input NAND gate 932 by means of a resistor 934 and to reference potential by means of a capacitor 936. The hold signal input terminal 176 is coupled to the input terminal of inverting amplifier 938. The output terminal of inverting amplifier 938 is coupled to a second input terminal 940 of the triple input NAND gate 932, and to a first input terminal 942 of dual input NAND gate 944 of low VHF band to high VHF band control circuit 904. A voltage having a level representative of when a six count is in the units register of the counter 118 is supplied to terminal 188 which is coupled to the input terminal of an inverting amplifier 946. The output terminal of inverting amplifier 946 is coupled to the second input terminal 948 of dual input NAND gate 944 by means of a resistor 950 and to reference potential by means of a capacitor 952.

The output terminal of a triple input NAND gate 932 of VHF and UHF control circuit 902 is coupled to the first input terminal 954 of dual input NAND gate 956. An output terminal 958 of dual input NAND gate 918 is coupled to the second input terminal 960 of dual input NAND gate 956 and to the output terminal 192. The output terminal 962 of dual input NAND gate 956 is coupled to the second input terminal 964 of dual input NAND gate 918 and to the output terminal 190. The dual input NAND gates 918 and 956, cross coupled in the aforementioned manner, provide for two stable states at the output terminals 958 and 962.

The output terminal of dual input NAND gate 944 of low VHF band-high VHF band control circuit 904 is coupled to a first input terminal 966 of dual input NAND gate 968. The output terminal 970 of dual input NAND gate 968 is coupled to a second input terminal 972 of dual input NAND gate 922. The output terminal 974 of dual input NAND gate 922 is coupled to a second input terminal 976 of dual input NAND gate 968. The dual input NAND gate 922 and the dual input NAND gate 968, cross coupled in the aforementioned manner, provide for two stable states at the output terminals 970 and 974.

The output terminal 970 of dual input NAND gate 968 of low VHF band-high VHF band flip-flop 908 is also coupled to the base of a high VHF band driver transistor 982 by means of a resistor 980 and to a third input terminal 978 of triple input NAND gate 932. The collector of transistor 982 is coupled to B+ by means of a resistor 984 and to the base of a high band VHF switching transistor 986 by means of a resistor 988. The emitter of transistor 986 is coupled to B+ (+35 volts) and the collector of transistor 986 is coupled to reference potential by means of a resistor 990 and to the terminal 196. The output terminal 974 of dual input NAND gate 922 is coupled to the base of a low band VHF driver transistor 922 by means of a resistor 994. The collector of transistor 992 is coupled to B+ (+35 volts) by means of a resistor 996 and to the base of a low VHF band switching transistor 998 by means of a resistor 901. The emitter of transistor 998 is coupled to B+ (+35 volts) and the collector of transistor 998 is coupled to reference potential by means of a resistor 903 and to terminal 198. The emitter of transistor 982 and the emitter of transistor 992 are coupled to the collector of a VHF switching transistor 905. The base of VHF switching transistor 905 is coupled to the output terminal 958 of dual input NAND gate 918 by means of a resistor 907. The emitter of transistor 905 is coupled to terminal 208 which is a source of reference direct potential (e.g., +0.7 volt DC).

The output terminal 962 of dual input NAND gate 956 of VHF-UHF flip-flop 906 is coupled to the base of a UHF driver transistor 909 by means of a resistor 951. The emitter of transistor 907 is coupled to terminal 208. The collector of transistor 907 is coupled to B+ (+35 volts) by means of a resistor 911 and to the base of a UHF switching transistor 913 by means of a resistor 915. The emitter of transistor 913 is coupled to B+ and the collector is coupled to reference potential by means of a resistor 953 and to the terminal 194.

The output terminal of dual input NAND gate 918 of VHF-UHF flip-flop 906 is also coupled to a first input terminal 917 of a triple input NAND gate 919 by means of a capacitor 921. The first input terminal 917 of triple input NAND gate 919 is also coupled to the anode of a diode 955 having its cathode coupled to reference potential by means of the parallel combination of a resistor 923 and a capacitor 925. A resistor 927 is coupled in parallel with diode 955. The output terminal 974 of dual input NAND gate 922 is also coupled to a second input terminal 929 of triple input NAND gate 919 by means of a capacitor 931. The second input terminal 929 of triple input NAND gate 919 is also coupled to the anode of a diode 933 having its cathode coupled to the cathode of diode 955. A resistor 935 is coupled in parallel with diode 933.

A third input terminal 937 of triple input NAND gate 919 of bandswitch reset control circuit 910 is coupled to the cathode of diode 933 by means of a resistor 939, to B+ (+5 volts), to a first input terminal 941 of dual input NAND gate 943, and to a second input terminal 945 of triple input AND gate 926. The output terminal of triple input NAND gate 919 is coupled to a second input terminal 947 of dual input NAND gate 943. The output terminal of dual input NAND gate 943 is coupled to a third input terminal 949 of triple input AND gate 926. The output terminal of triple input AND gate 926 is coupled to terminal 200.

The voltages supplied from terminals 190 through 198 provide for making the proper tuner (VHF or UHF) operational in a proper manner for reception in radio frequency bands (low VHF band, high VHF band, and UHF) for translating the frequency of a sample of the VHF oscillator signal on channels 5 and 6 under the appropriate additional conditions, for determining the phase of the automatic fine turning correction signal applied to a monostable (one-shot) network in the beat frequency discriminator 68, and for determining the phase relationship between the signal developed at the terminal 74 of beat frequency discriminator 68 and the signal coupled to the counter 118. An additional output at terminal 200 is coupled to the tuner frequency controller and provides a bandswitch reset pulse for resetting the tuner frequency controller 101 (FIG. 1).

In operation, with B+ applied to the tuner bandswitching system, positive voltage is supplied to terminal 917 via resistors 939 and 927, to terminal 929 via resistors 939 and 935, and directly to terminal 937 of triple input NAND gate 919. Furthermore, terminal 941 of dual input NAND gate 943 is positive, and terminal 945 of triple input AND gate 926 is positive. With terminals 917, 929 and 937 of triple input NAND gate 919 positive, terminal 947 of dual input NAND gate 943 is at approximately zero volts and terminal 949 of triple input AND gate 926 is positive, making the bandswitch result voltage at terminal 200 positive under these conditions.

When the second digit of a selected channel is entered into selected channel memory 148 (FIG. 1), a positive retune reset pulse is supplied by the selected channel memory 148 to the terminal 184 and is inverted by the inverting amplifier 914. The output of inverting amplifier 914 provides a negative retune reset pulse (e.g., +4 volt reference level) to terminal 924 of AND gate 926, to terminal 916 of NAND gate 918, and to terminal 920 of NAND gate 922. The negative pulse applied to terminal 924 creates a negative bandswitch reset pulse on terminal 200. The negative pulse applied to terminals 916 and 920 of NAND gates 918 and 922, respectively, makes the terminals 958, 960, 974 and 976 go positive. Since the retune reset pulse supplied by memory 148 also resets the counter 118 (FIG. 1) to an initial (e.g., 00) count, the terminals 186 and 188 of tuner bandswitching system 178 are positive. The voltages at terminal 930 of NAND gate 932 and at terminal 948 of NAND gate 944 are thereof approximately zero volts, making the voltage at terminal 954 of NAND gate 956 and at the terminal 966 of NAND gate 968 positive. With terminals 954 and 960 of NAND gate 956 positive, terminals 962 and 964 are at zero volts. Therefore, the terminal 958 will remain positive after the retune reset pulse. With terminals 966 and 976 of NAND gate 968 positive, terminals 970 and 972 are at zero volts; therefore, the terminal 974 will remain positive after the retune reset pulse.

With a positive voltage on terminals 958 and 974, terminal 192 will be positive and the transistors 905 and 992 are placed in saturation by means of base-emitter current supplied by resistors 907 and 994, respectively. The transistor 992 and the transistor 905 being saturated provides base-emitter current flow in the transistor 998 via resistor 901 which causes saturation of transistor 998. With transistor 998 saturated, the voltage at terminal 198 (which is coupled to VHF tuner 14 — FIG. 1) is approximately B+ (+35 volts).

With zero volts at terminal 962 of VHF-UHF flip-flop 906, the transistor 909 is cut off; thus, no base-emitter current flows in the transistor 913. Therefore, transistor 913 is also cut off and the voltage at terminal 194 (which is coupled to UHF tuner 12 — FIG. 1) is approximately 0. Also, with the voltage at terminal 970 of low VHF band-high VHF band flip-flop 908 equal to approximately zero, the transistor 982 is cut off; thus, no base-emitter current flows in the transistor 986. Therefore, transistor 986 is also cut off and the voltage at terminal 196 (which is coupled to VHF tuner 14) is approximately 0.

With positive voltage on terminals 192 and 198, the VHF tuner 14 is operational in the low VHF band. To change to the high VHF band, a negative pulse must be applied to terminal 966 of low VHF band-high VHF band flip-flop 908. To change from VHF to UHF, to negative pulse must be applied to terminal 954 of VHF-UHF flip-flop 906.

TUNING CHANNELS 02 THROUGH 06

For all data in counter 118 (FIG. 1) in this band (02 through 06) other than 06, the terminal 188 of bandswitching system 178 is positive and terminal 948 will be at zero volts. Therefore, the hold voltage on terminal 176 has no effect on the voltage at terminal 966. When the data in the counter 118 equals 06, terminal 188 goes to 0 volts and terminal 948, at some thereafter due to the integrating or delay effect of capacitor 952 in conjunction with resistor 950, goes positive.

If the data in the selected channel memory 148 (FIG. 1) also is 06, a hold signal will be generated, the terminal 176 will go positive and terminal 942 will go to zero before terminal 948 goes positive. Therefore, the output of NAND gate 944 will not produce a negative pulse and a shift will not be made to the high VHF band, but rather the tuner will be held in the low VHF, channel 6 tuning condition.

LOW VHF TO HIGH VHF BANDSWITCHING

If the data in the selected channel memory 148 (FIG. 1) is greater than 06, terminal 176 will remain at zero (no hold) when the data in the counter 118 is 06. The terminals 188 and 176 will, therefore, both go to zero volts and terminals 942 and 948 will go positive. As terminals 942 and 948 go positive, the terminal 966 will go to zero. With a zero voltage on terminal 966 of NAND gate 968, the voltage at terminal 970 of NAND gate 968 and the voltage at terminal 972 of NAND gate 922 go positive. Since the voltage at terminal 920 of NAND gate 922 is positive because the retune reset pulse is no longer existent, the voltage at terminal 974 of NAND gate 922 goes to approximately 0 volts. The voltage on terminal 976 of NAND gate 968 also goes to approximately 0 volts. Therefore, the voltage at terminal 970 is independent of subsequent voltages at terminal 966 of NAND gate 968. With a positive voltage on terminal 970 of NAND gate 968, the transistor 982 will be saturated by means base-emitter current flow via resistor 980, therefore saturating transistor 986 by means of base-emitter current flow via resistor 988. With transistor 986 saturated, the voltage at terminal 196 is equal to B+ (+35 volts). The positive voltages at terminals 192 and 196 provide for operation of the VHF tuner 14 (FIG. 1) in the high VHF band. With 0 volts on terminal 974, the transistor 992 and the transistor 998 are cut off. Therefore, terminal 198 is at 0 volts.

When the voltage at terminal 974 goes to approximately 0 volts, a negative pulse is applied to terminal 929 of gate 919 by means of the differentiator comprised of capacitor 931, diode 933 and resistor 935. The negative pulse applied to terminal 929 causes the voltage at terminal 947 to go positive, the voltage at terminal 949 to go negative, and the voltage at terminal 200 also to go negative, thus providing a bandswitch reset pulse to the tuner frequency controller 101 (FIG. 1).

TUNING CHANNELS 07 THROUGH 13

For all data in counter 119 (FIG. 1) in this band (02 through 13) other than 13 inclusive the terminal 186 is positive and the terminal 930 is at zero volts. Therefore, the voltage on terminal 176 has no effect on the voltage at terminal 954. When the data in the counter 118 equals 13, terminal 186 goes to zero volts and terminal 930, at some time thereafter due to the integrating effect of capacitor 936 in conjunction with resistor 934, goes positive. Since the low VHF band-high VHF band flip-flop 908 is in the high VHF band mode to tone channel 13, terminal 970 is positive and therefore terminal 978 of NAND gate 932 is positive.

If the data in the selected channel memory 148 (FIG. 1) is 13 the terminal 176 will go positive and terminal 940 will go to zero before terminal 930 goes positive; therefore, the output of NAND gate 932 will not produce a negative pulse and a shift will not be made to the UHF band.

VHF TO UHF BANDSWITCHING

If the data in the selected channel memory 148 (FIG. 1) is greater than 13, terminal 176 will remain at 0 when the data in the counter is 13. The terminals 186 and 176 will, therefore, both go to 0 volts and terminals 930 and 940 will go positive. As terminals 930 and 940 go positive with terminal 978 positive, the terminal 954 will go to 0. With 0 volts applied to terminal 954, the voltage at terminal 962 of NAND gate 956 and terminal 964 of NAND gate 918 go positive. With a positive voltage on terminal 964 and terminal 916, the voltage at terminal 958 goes to approximately 0 volts. With a positive voltage on terminal 962, transistor 909 and transistor 913 are saturated. With transistor 913 saturated, the voltage at terminal 194 is approximately B+.

With 0 volts on terminal 958 of VHF-UHF flip-flop 906, transistor 905 is cut off and the voltages at terminals 196 and 198 are approximately 0 volts. When the voltage at terminal 958 goes to approximately 0 volts, a negative pulse is applied to terminal 917 of NAND gate 919 by means of the differentiator comprising the capacitor 921, the resistor 927 and the diode 955. With a negative pulse on terminal 917 of triple input NAND gate 919, a positive pulse occurs at terminal 947 of NAND gate 943, a negative pulse is applied to terminal 949 of AND gate 926, and a negative pulse occurs at terminal 200, thus again providing a bandswitch reset pulse to the tuner frequency controller 101 (FIG. 1).

What is claimed is:

1. In a television tuning system for selecting any one of a plurality of television channels in at least first and second bands of frequencies by sweeping an oscillator through at least third and fourth bands of frequencies, a system for controlling the operating frequency range of said tuning system, comprising:
    channel selector means for providing signals representative of a selected television channel number;
    counting means for counting the number of times said oscillator passes through a frequency related in a predetermined manner to a television channel oscillator frequency;
    storage means coupled to said channel selector means for storing numerical data representative of said selected channel number;
    count comparison means for producing a hold signal when data in said counting means and said storage means are equal;
    control signal generating means for providing control signals in response to simultaneous presence in said counting means of a count representative of a channel at one end of at least said first band of frequencies and absence of said hold signal; and
    switching means responsive to said control signals for switching the operating range of said oscillator at least from said third band to said fourth band of frequencies.

2. The combination as in claim 1 and further comprising:
    a reset means for developing a bandswitch reset pulse for resetting said sweep of said oscillator in response to the switching of the operating range of said oscillator from said third band to said fourth band of frequencies.

3. The combination as in claim 1 wherein said control signal generating means comprises:
    a predetermined count identification means for providing an identification signal when said data in said counter equals said count representative of said channel at one end of at least said first band of frequencies; and
    a combining means for providing said control signals in response to the existence of said identification signal and the absence of said hold signal.

4. The combination as in claim 3 wherein said combining means comprises an integrating means for providing for a delay of said identification signal until said count comparison means tests for equivalency of said data in said counting means and said storage means.

5. In a television tuning system for selecting any one of a plurality of television channels in first, second and third bands of frequencies by sweeping an oscillator through fourth, fifth and sixth bands of frequencies, a system for controlling the operating frequency range of said tuning system, comprising:
    channel selector means for providing signals representative of a selected television channel number;
    counting means for counting the number of times said oscillator passes through a frequency related in a predetermined manner to a television channel oscillator frequency;
    storage means coupled to said channel selector means for storing numerical data representative of said selected channel number;
    count comparison means for producing a hold signal when data in said counting means and said storage means are equal;
    control signal generating means for providing first control signals in response to simultaneous presence in said counting means of a count representative of a channel at one end of said first band of frequencies and for providing second control signals in response to simultaneous presence in said counting means of a count representative of a channel at one end of said second band of frequencies; and
    switching means responsive to said first and second control signals for switching the operating range of said oscillator from said fourth band to said fifth band in response to said first control signals and from said fifth band to said sixth band in response to said second control signals.

6. The combination as in claim 5 and further comprising:
    a reset means for developing a bandswitch reset pulse for resetting said sweep of said oscillator in response to the switching of the operating range of said oscillator from said fourth band to said fifth band of frequencies and from said fifth band to said sixth band of frequencies.

7. The combination as in claim 5 wherein said control signal generating means comprises:
   a first predetermined count identification means for providing a first identification signal when said data in said counter equals said count representative of said channel at one end of said first band of frequencies;
   a second predetermined count identification means for providing a second identification signal when said data in said counter equals said count representative of said channel at one end of said second band of frequencies;
   a first combining means for providing said first control signals in response to the existence of said first identification signal and the absence of said hold signal;
   a second combining means for providing said second control signals in response to the existence of said second identification signal and the absence of said hold signal.

8. The combination as in claim 7 wherein said first combining means comprises a first integrating means for providing for a delay of said first identification signal until said count comparison means tests for equivalency of said data in said counting means and said storage means and said second combining means comprises a second integrating means for providing for delay of said second identification signal until said count comparison means tests for equivalency of said data in said counting means and said storage means.

* * * * *